United States Patent
Wu

(10) Patent No.: US 7,486,560 B2
(45) Date of Patent: Feb. 3, 2009

(54) APPARATUS AND ASSOCIATED METHOD FOR MAKING A VIRTUAL GROUND ARRAY STRUCTURE THAT USES INVERSION BIT LINES

(75) Inventor: Chao-I Wu, Tainan (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/424,748

(22) Filed: Jun. 16, 2006

(65) Prior Publication Data

US 2007/0291541 A1 Dec. 20, 2007

(51) Int. Cl.
*G11C 11/34* (2006.01)
*G11C 16/04* (2006.01)
*H01L 29/76* (2006.01)

(52) U.S. Cl. .......................... 365/185.18; 365/185.16; 257/314

(58) Field of Classification Search ............ 365/185.16, 365/185.18
See application file for complete search history.

(56) References Cited

U.S. PATENT DOCUMENTS

| 6,873,004 | B1 | 3/2005 | Han et al. | |
| 7,133,317 | B2* | 11/2006 | Liao et al. | 365/185.28 |
| 7,158,420 | B2* | 1/2007 | Lung | 365/185.3 |
| 2005/0062096 | A1* | 3/2005 | Sasago et al. | 257/321 |
| 2006/0245246 | A1* | 11/2006 | Lung | 365/185.3 |

OTHER PUBLICATIONS

Boaz Eitan, Paolo Pavan, Ilan Bloom, Efraim Aloni, Aviv Frommer and David Finzi, NROM: A novel Localized Trapping, 2-Bit Non-volatile Memory Cell, IEEE Electron Device Letters, vol. 21, No. 11, Nov. 2000.

Y. Sasago, et al., 90-nm-node Multi Level AG-AND Type Flash Memory with Cell Size of True 2F2/bit and Programming Throughout of 10 MB/s, IEEE, 2003.

* cited by examiner

*Primary Examiner*—Ly D Pham
(74) *Attorney, Agent, or Firm*—Baker & McKenzie, LLP

(57) ABSTRACT

A virtual ground array structure uses inversion bit lines in order to eliminate the need for implanted bit lines. As a result, the cell size can be reduced, which can provide greater densities and smaller packaging.

15 Claims, 17 Drawing Sheets

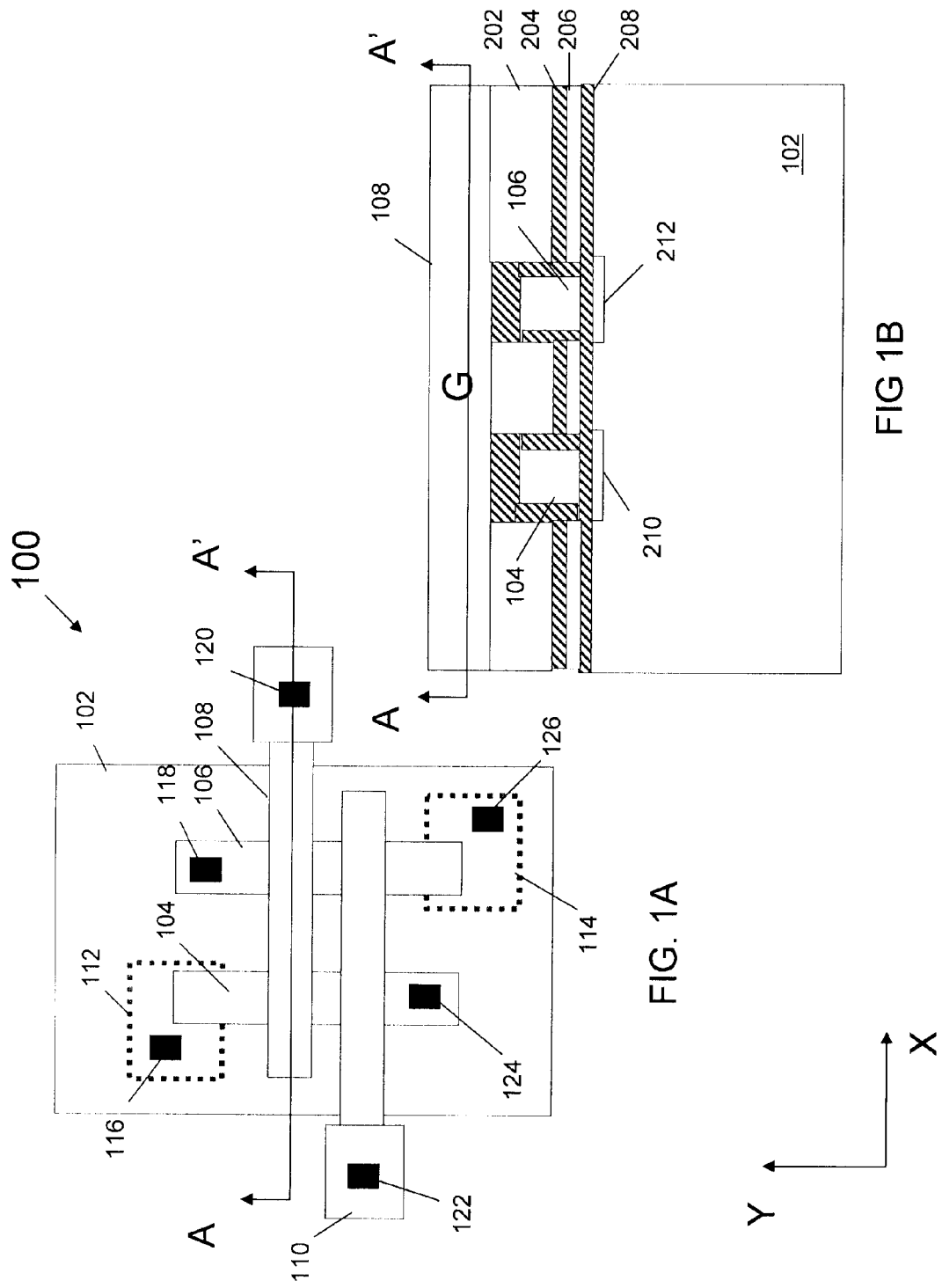

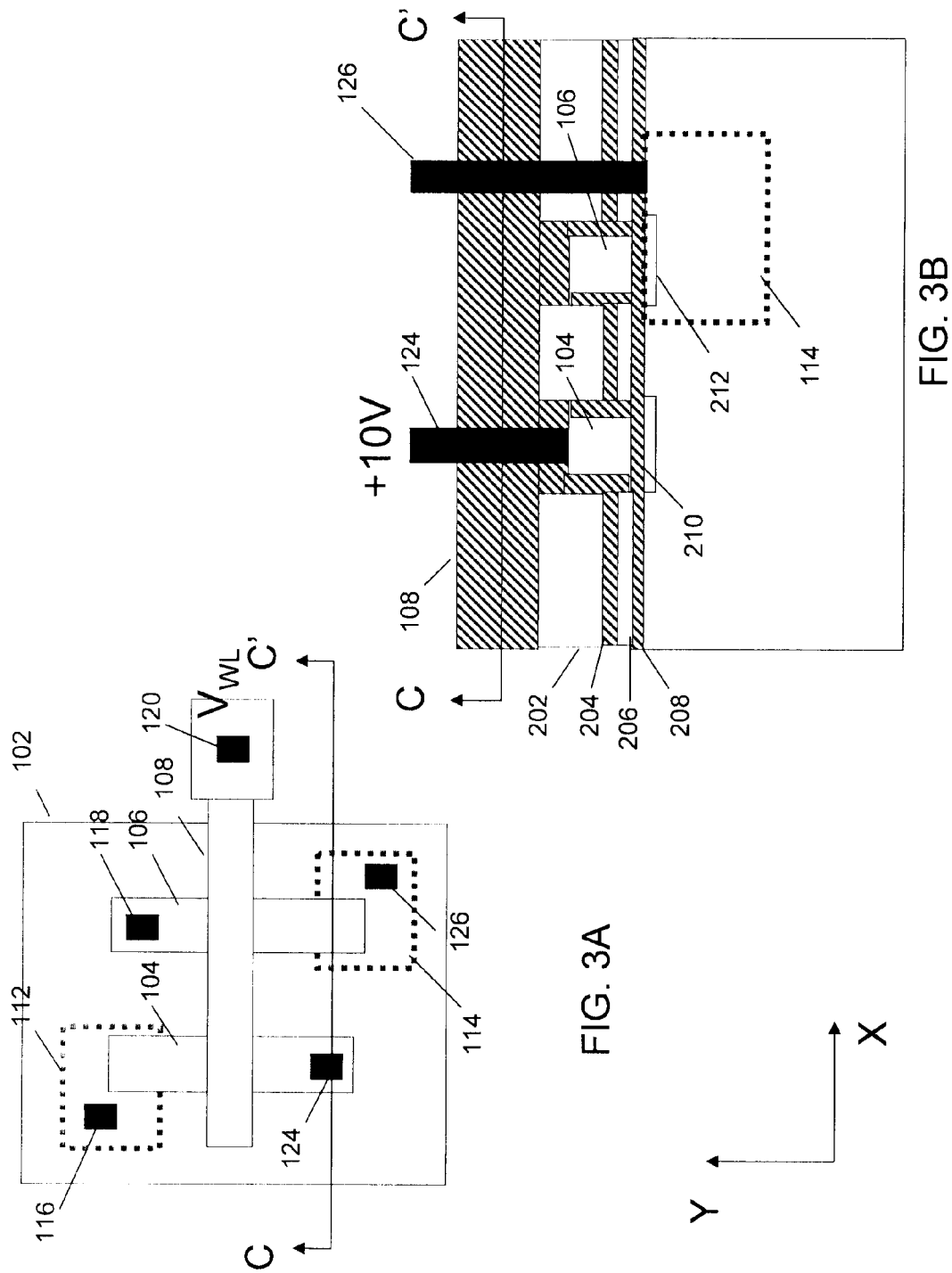

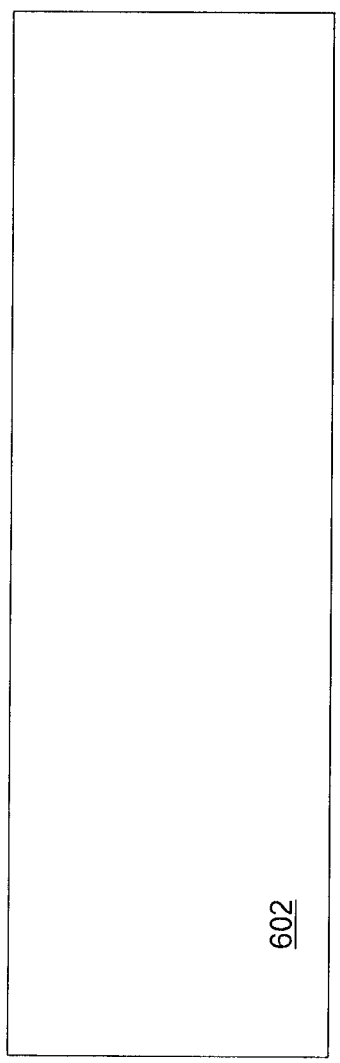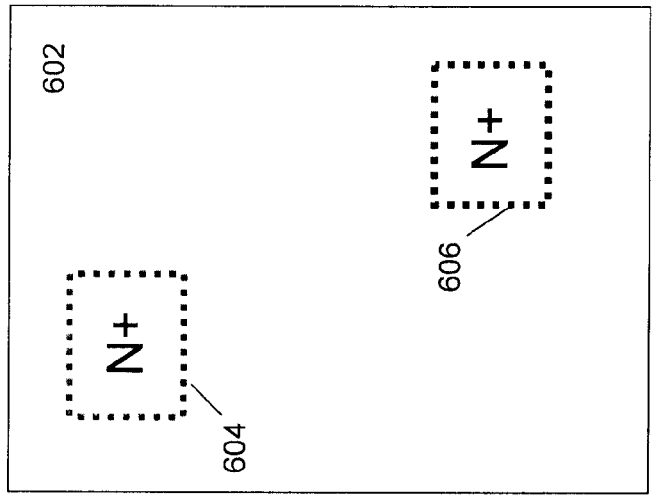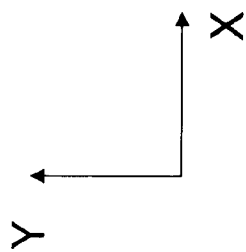

APPARATUS AND ASSOCIATED METHOD FOR MAKING A VIRTUAL GROUND ARRAY STRUCTURE THAT USES INVERSION BIT LINES

BACKGROUND

1. Field of the Invention

The embodiments described herein are directed to virtual ground array memory structures, and more particularly to a virtual ground array structure that uses inversion bit lines in place of the conventional implanted bit lines.

2. Background of the Invention

It is well known to use virtual ground array designs in order to reduce the cell size for non-volatile memory products, such as flash memory products. While virtual ground structures have allowed reduction in the overall cell size in a virtual ground array, the achievable cell size reductions are still limited. As new applications call for ever smaller packaging and increased densities, further reductions in cell size are highly desirable.

One limitation in cell size reduction for conventional virtual ground structures, for example, is the need for implanted bit lines. The inclusion of the implanted bit lines requires a certain area for each cell. If the need for the implanted bit lines is eliminated, then the cell size can be reduced; however, conventional virtual ground array structures require the implanted bit lines.

SUMMARY

A virtual ground array structure uses inversion bit lines in order to eliminate the need for implanted bit lines. As a result, the cell size can be reduced, which can provide greater densities and smaller packaging.

In another aspect, a method for fabricating a virtual ground array structure that uses inversion bit lines is disclosed.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 1A is a diagram illustrating a top view of a virtual ground array structure that includes two word lines and uses inversion bit lines in accordance with one embodiment;

FIG. 1B is a diagram illustrating a cross section of the structure of FIG. 1A.

FIGS. 3A and 3B are diagrams illustrating the example operation of the structure of FIG. 2;

FIGS. 6A-6H are diagrams illustrating an example process for fabricating the structure of FIG. 1;

FIG. 6I is a diagram illustrating the top view of an example structure fabricated using the process steps illustrated in FIGS. 6A-6H;

DETAILED DESCRIPTION

Figures 2A, 2B:
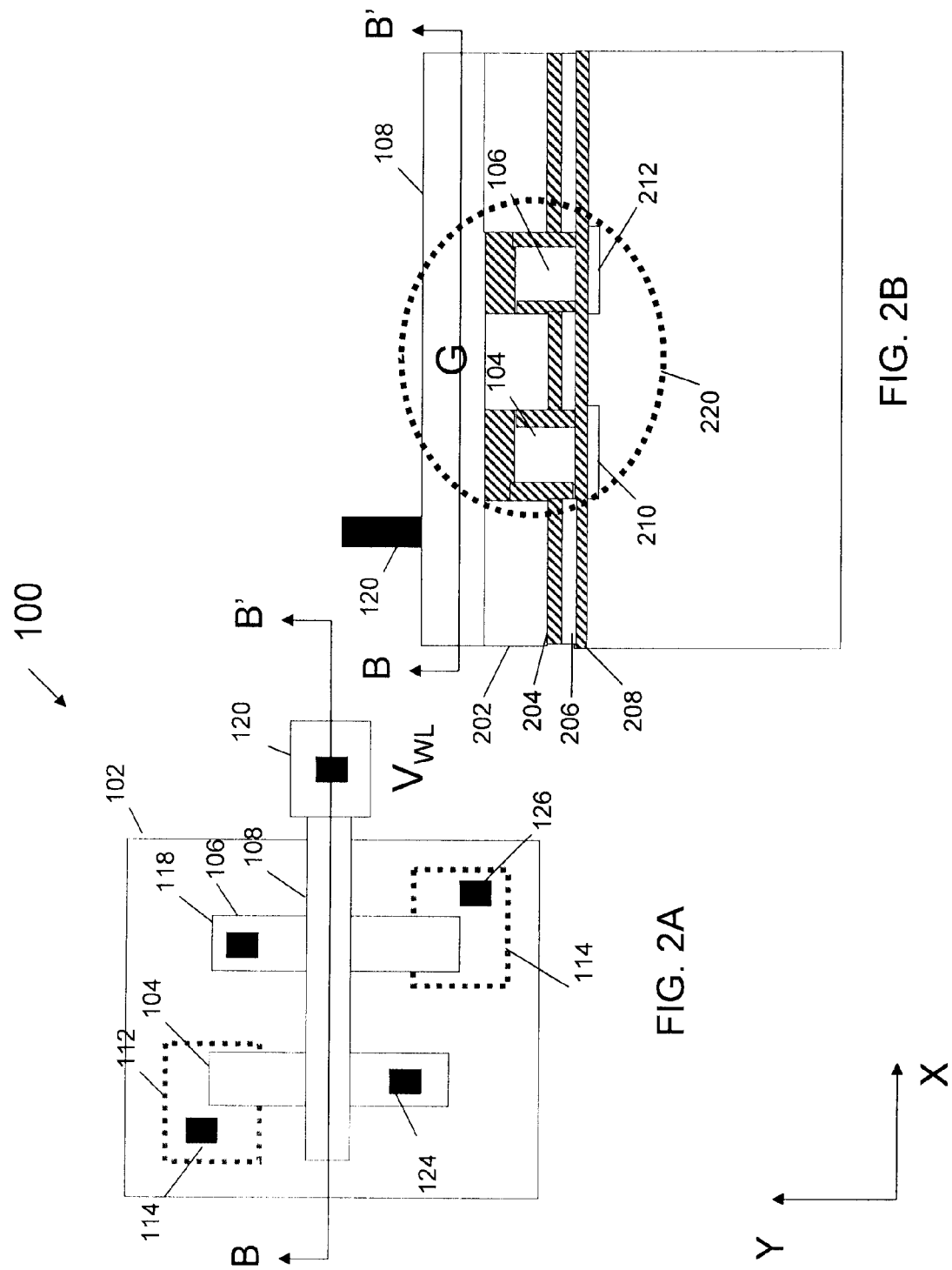
FIG. 2A is a diagram illustrating a top view of a virtual ground array structure that includes a single word line and uses inversion bit lines in accordance with another embodiment.
FIG. 2B is a diagram illustrating a cross section of the device of the structure of FIG. 2A.

In the embodiments described below reduced cell sizes in a virtual ground array can be achieved by eliminating implanted bit lines. In place of the implanted bit lines, the structures described herein use inversion bit lines to conduct the drain and source voltages required for operation. The elimination of implanted bit lines reduces the area required for each cell and allows a reduced cell size.

FIG. 1A is a diagram illustrating a top view of a virtual ground array structure 100 configured in accordance with one embodiment. Structure 100 is formed on a substrate 102. In the example of FIG. 1A, substrate 102 is a P-type substrate; however, it will be understood that in other embodiments substrate 102 can be an N-type substrate. N+ implanted diffusion regions 112 and 114 are then formed in substrate 102. Diffusion regions 112 and 114 can act as source and drain regions for a particular cell as will be explained below. Polysilicon bit lines 104 and 106 are then formed on substrate 102 as illustrated. Polysilicon word lines 110 and 108 are then formed over and perpendicular to bit lines 104 and 106. In the example of FIG. 1A, bit lines 104 and 106 are formed in the Y direction, while word lines 110 and 108 are formed in the X direction.

Various contacts are then formed that contact diffusion regions 112 and 114, bit lines 104 and 106, and word lines 108 and 110. Thus, contact 116 is formed so as to contact implantation region 112, contact 126 is formed so as to contact implantation region 114, contact 118 is formed so as to contact bit line 106, contact 120 is formed so as to contact word line 108, contact 122 is formed so as to contact word line 110, and contact 124 is formed so as to contact bit line 104. These contacts can be used to supply the appropriate voltages to the appropriate portions of the cell.

FIG. 1B is a diagram illustrating a cross section of structure 100 along line AA'. As can be seen in the cross section, word line 108 is formed over a polysilicon layer 202. Word line 108 can be said to be formed from a third poly layer, while polysilicon layer 202 can be referred to as a first poly layer. Bit lines 104 and 106 can then be formed from a second poly layer. The third poly and the first poly layers can be connected so as to form a gate structure between bit lines 104 and 106. A gate dielectric layer can then be formed under the gate structure.

In the example of FIG. 1, the gate dielectric layer below the gate structure includes an Oxide-Nitride-Oxide (ONO) layer formed from oxide layer 204, nitride layer 206, and oxide layer 208. Oxide layers 204 and 208 can, e.g., be silicon dioxide ($SiO_2$) layers, while nitride layer 206 can be a Silicon Nitride (SiN) layer.

In the example of FIG. 1, dielectric layer 208 also extends below polysilicon bit lines 104 and 106. Thus, in the example of FIG. 1, there is a single dielectric layer 208 below polysilicon bit lines 104 and 106 and above inversion bit lines 210 and 212. In other embodiments, however, the dielectric layer below polysilicon bit line 104 and 106 can comprise an Oxide-Nitride (ON) structure. In still other embodiments, the dielectric layer below polysilicon bit lines 104 and 106 can comprise an ONO structure. Depending on the fabrication process used, the dielectric layer below polysilicon bit lines 104 and 106 can also comprise a residual oxide layer left after an ON etching process, or re-grown oxide layer formed after an ONO etching process.

As can be seen, structure 100 does not comprise implanted bit lines below with polysilicon bit lines 104 and 106. Instead, when the appropriate voltages are applied to bit lines 104 and 106, inversion bit lines 210 and 212 will be formed. Inversion bit lines 210 and 212 can then be used to conduct the source and drain voltages as required.

FIG. 2A is diagram illustrating a top view of a virtual ground array structure 200 that is similar to structure 100, except that structure 200 only includes a single word line 108. FIG. 2B is a diagram illustrating a cross section along the line BB' of structure 200.

As with FIG. 1A, it can be seen that word line 108 can be formed from a third poly layer. The third poly layer can be formed on top of another polysilicon layer 202, which can be referred to as the first poly layer. The first and third poly layers can form a gate structure. The gate structure can also comprise a gate dielectric. The gate dielectric can be an ONO structure, e.g., formed from layers 204, 206, and 208.

Bit lines 104 and 106 can then be formed from another polysilicon layer, which can be referred to as the second poly layer. Dielectric layer 208 can extend under bit lines 104 and 106. Alternatively, an ON or ONO dielectric structure can be included in the regions under bit lines 104 and 106.

The various layers and associated contacts can be fabricated so as to form cells, such as cell 220. Cell 220 can be used to illustrate the application of various voltages during operation of a device comprising structure 200. It will be understood that similar operation principles will apply for a two word line (or more) structure, such as that illustrated in FIG. 1.

Figures 4A, 4B:
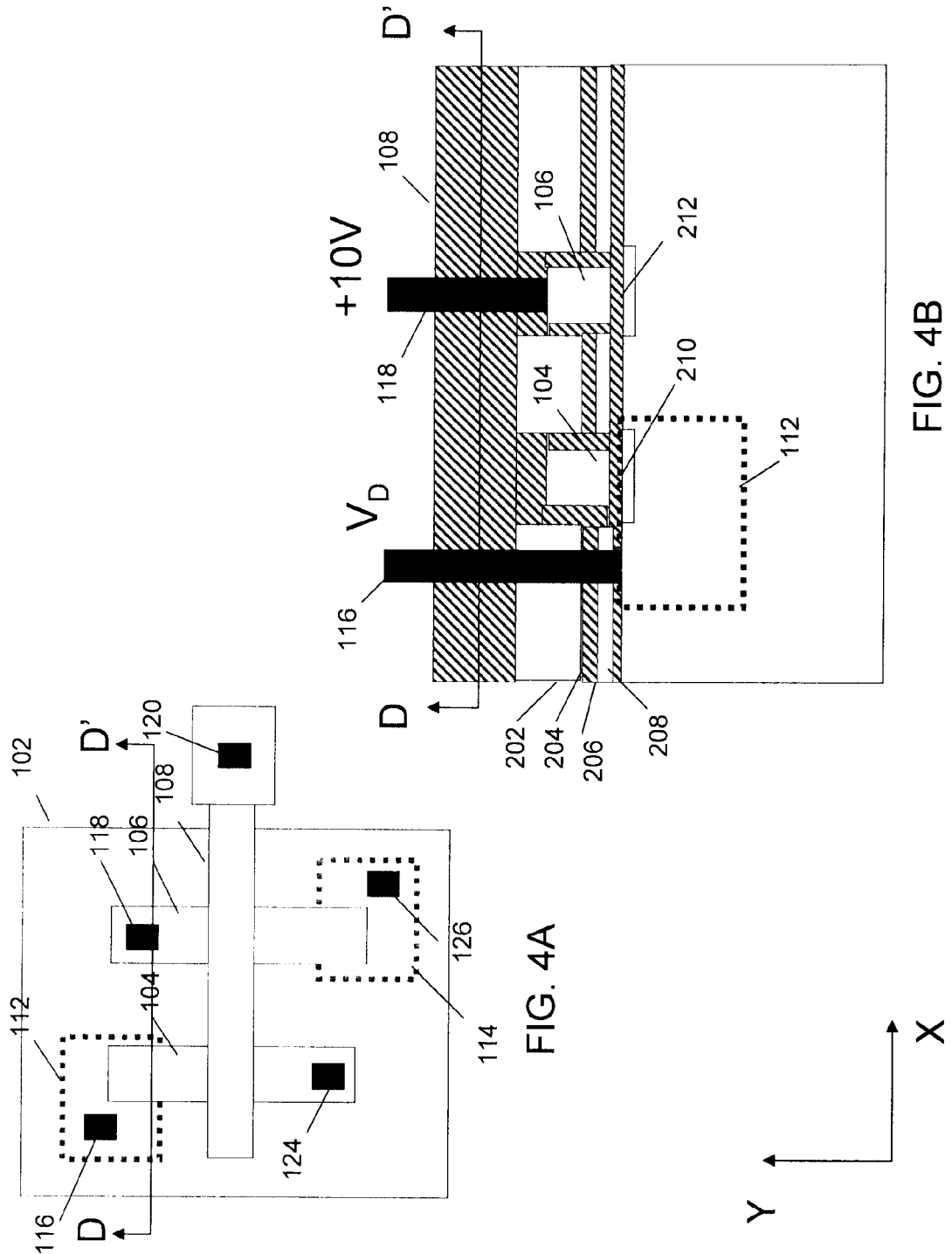
FIGS. 4A and 4B are diagrams illustrating further example operation of the device of the structure of FIG. 2.

Inversion bit lines 210 and 212 can be formed by applying sufficient voltage to bit lines 104 and 106 respectively. For example, FIG. 3 is a diagram illustrating a cross section of structure 100 along the line CC'. As illustrated, inversion bit line 210 can be formed by applying a sufficient voltage, e.g., approximately +10 volts, to bit line 104 via contact 124. Similarly, FIG. 4 is a diagram illustrating a cross section of structure 100 across the line DD'. As can be seen, inversion bit line 212 can be formed by applying a sufficient voltage, e.g., approximately +10 volts, to bit line 106 via contact 118.

Once inversion bit lines 210 and/or 212 are formed, cell 220 can be programmed, erased, or read, by applying the appropriate voltages to word line 120, source region 114, and drain region 112. Applying the appropriate voltage to word line 120 will create a channel region between source and drain regions 114 and 112 respectively. Applying the appropriate voltages to drain region 112 and source region 114, via contacts 116 and 126 respectively, can then create the lateral field necessary to cause carriers to migrate into the channel region and flow between drain region 112 and source region 114. Device operating methods and conditions are described in detail with respect to FIGS. 7-12.

Figure 5:
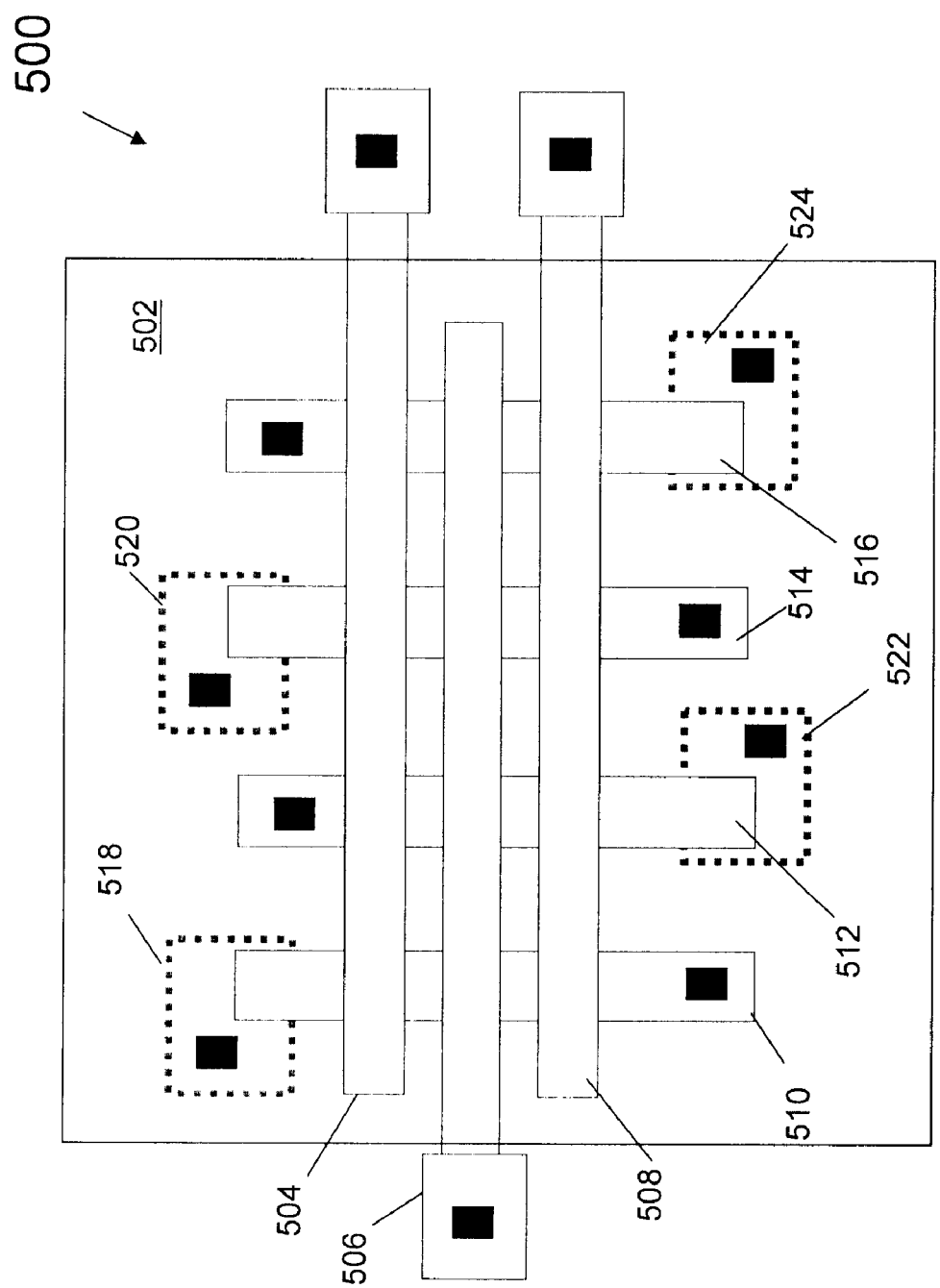
FIG. 5 is a diagram illustrating an array architecture that uses inversion bit lines in accordance with one embodiment.

FIG. 5 is a diagram illustrating a virtual ground array structure 500 configured in accordance with one embodiment. Like structure 100, structure 500 uses inversion bit lines in order to reduce the cell size and therefore the overall size of array 500. As can be seen, array 500 comprises a substrate 502 with implanted drain/source regions 518, 520, 522, and 524. Bit lines 510, 512, 514, and 516 are then formed over substrate 502 in a Y direction. Word line 504, 506, and 508 are then formed perpendicular to bit lines 510, 512, 514, and 516 as illustrated.

By applying the appropriate voltage to bit line 510, 512, 514, and/or 516, inversion bit lines can be formed within the upper layer of substrate 502 under bit lines 510, 512, 514 and/or 516. Application of the appropriate voltages to word line 504, 506, and/or 508, can then allow access to the appropriate cell in array 500. The word line voltage will create a channel between source and drain regions for the cell, the inversion bit lines will conduct the appropriate drain and source voltages for programming, erasing, and reading.

Figure 7:
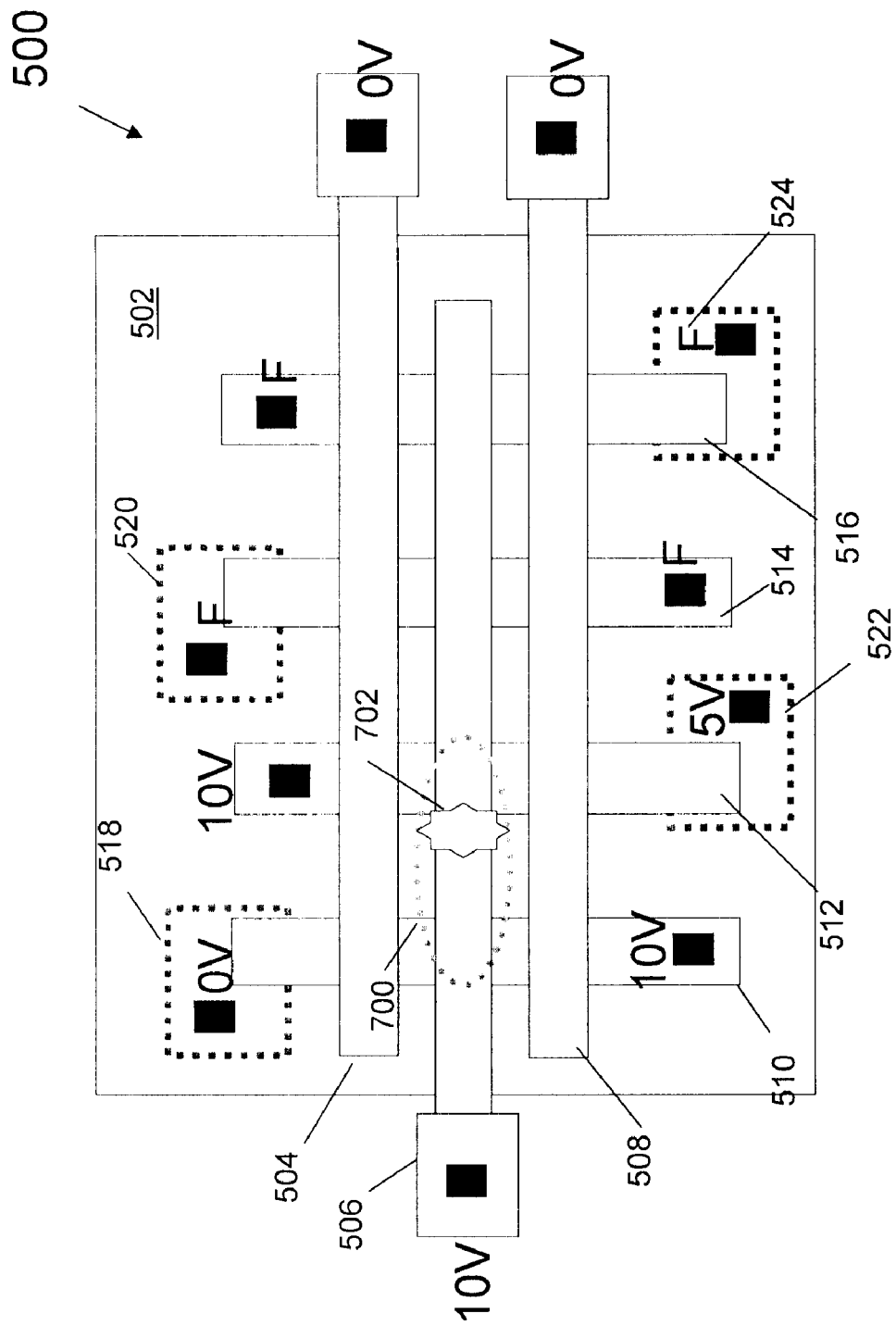
FIG. 7 is a diagram illustrating one example method for programming a first bit of a selected cell in the array of FIG. 5 in accordance with one embodiment.

FIGS. 7-12 are diagrams illustrating example methods for operating array 500 in accordance with certain embodiments. FIG. 7 is a diagram illustrating an example process for programming a first bit 702 of a selected cell 700 within array 500. In the example of FIG. 7, bit 702 can be programmed via Channel Hot Electron (CHE) programming techniques. In order to program bit 702 via CHE programming, a positive voltage must first be applied to bit lines 510 and 512 to create inversion bit lines in substrate 502 under bit lines 510 and 512. In the example of FIG. 7, a positive voltage of approximately +10 volts is applied to bit lines 510 and 512. A positive voltage must also be applied to word line 506 in order to create a channel under the gate region of cell 700. In the example of FIG. 7, a positive voltage of approximately +10 volts is applied to word line 506. A high voltage must be applied to diffusion region 522, while a low voltage is applied to diffusion region 518. In the example of FIG. 7, a high voltage of approximately +5 volts is applied to diffusion region 522, while a low voltage of 0 volts is applied to diffusion region 518.

It will be understood, that the voltages illustrated in FIG. 7 are by way of example only and that the actual voltages used will depend on the requirements of a specific implementation. For example, a voltage in the range of +5-+10 volts can be applied to bit lines 104 and 106.

The voltages applied to diffusion regions 518 and 522 generate a large lateral electric field that causes electrons to flow into a channel created under word line 506. The positive voltage applied to word line 506 then causes those electrons to inject into the gate structure of cell 700. During the programming operation, bit lines 514 and 516 can be left floating as can diffusion regions 520 and 524. Word lines 504 and 508 can be tied to 0 volts.

Figure 8:
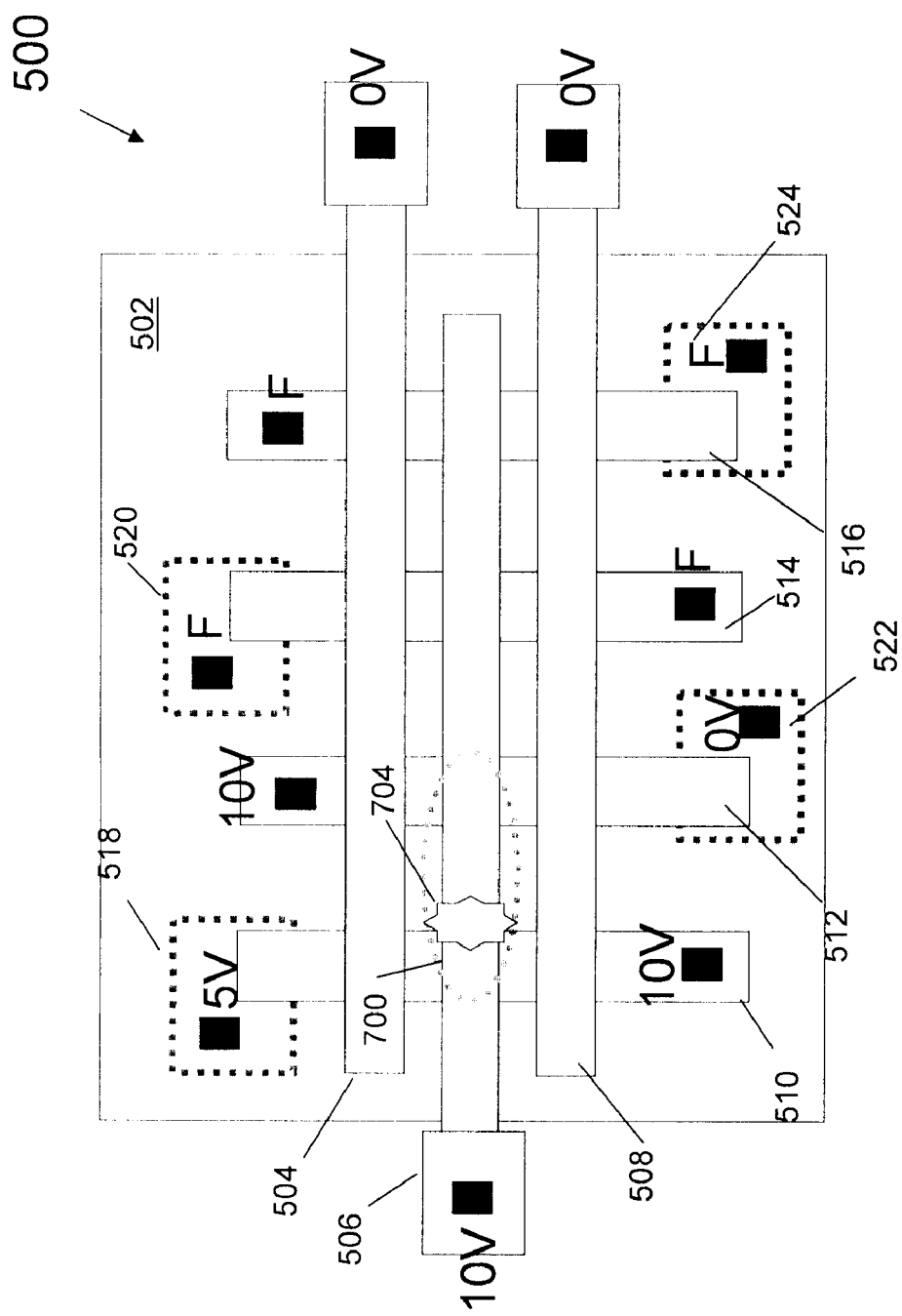
FIG. 8 is a diagram illustrating one example method for programming a second bit of a selected cell.

FIG. 8 is a diagram illustrating CHE programming of a second bit 704 of selected cell 700. As with the programming of bit 702, a positive voltage is applied to each of bit lines 510 and 512 in order to create inversion bit lines in the upper layers of substrate 502 under bit lines 510 and 512. Again, these inversion bit lines are used to conduct the source and drain voltages needed to program bit 704. A positive voltage is then applied to word line 506 in order to activate the channel under the gate structure of selected cell 700. Additionally, diffusion region 518 is tied to a high voltage while diffusion region 522 is tied to a low voltage to generate the lateral electric field needed to cause electrons to enter the channel of cell 700. The high voltage on word line 506 will then cause some of these electrons to inject into the gate structure, thus programming bit 704.

In the example of FIG. 8, positive voltages of approximately +10 volts are applied to bit lines 510 and 512, as well as word line 506. A high voltage of approximately +5 volts is applied to diffusion region 518, while a low voltage of approximately 0 volts is applied to diffusion region 522. It will be understood, however, that the voltages illustrated with respect to the example of FIG. 8 are by way of example only and that the actual voltages will depend on the requirements of a specific implementation.

Figure 9:
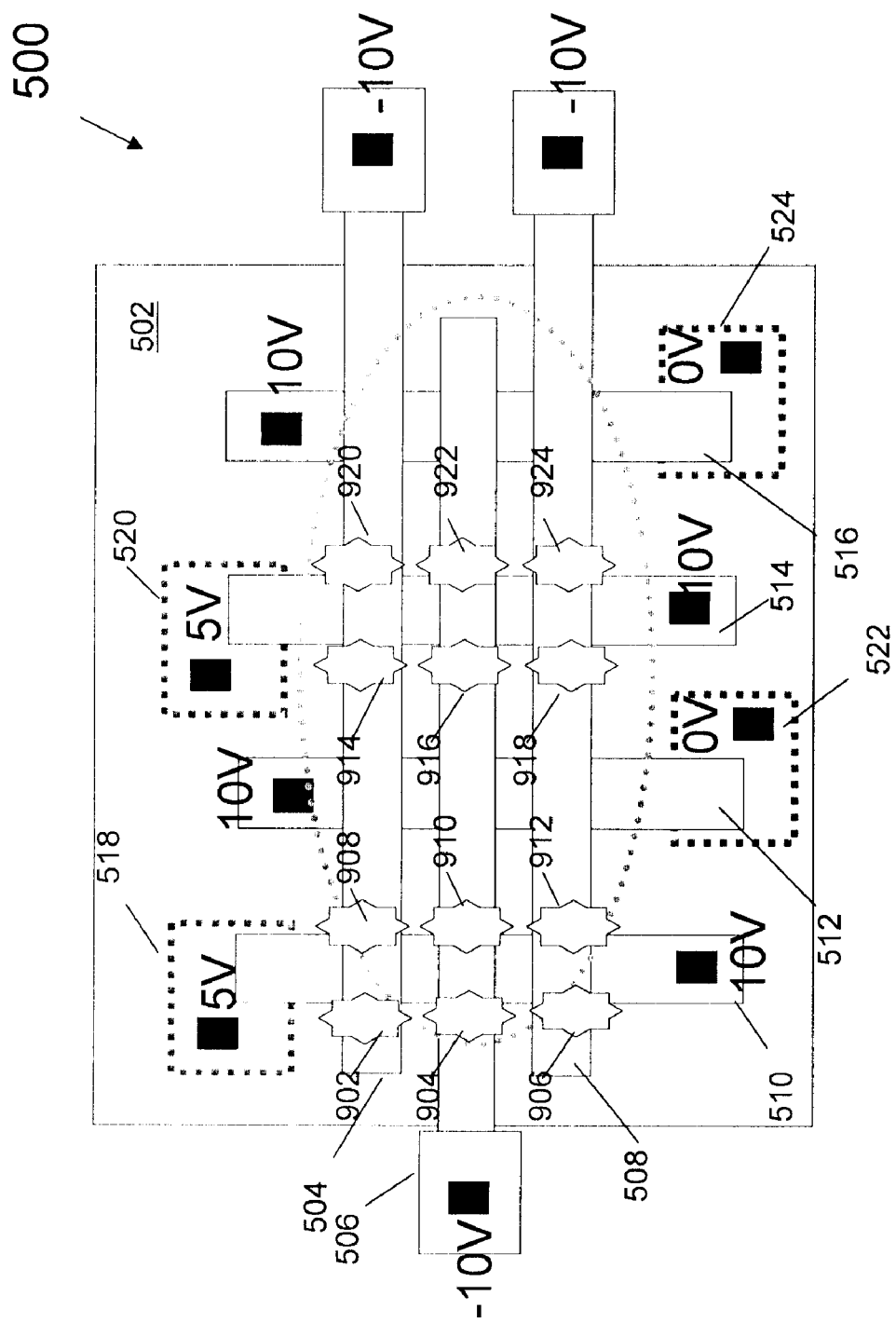
FIG. 9 is a diagram illustrating one example method for erasing multiple bits.
Figure 10:
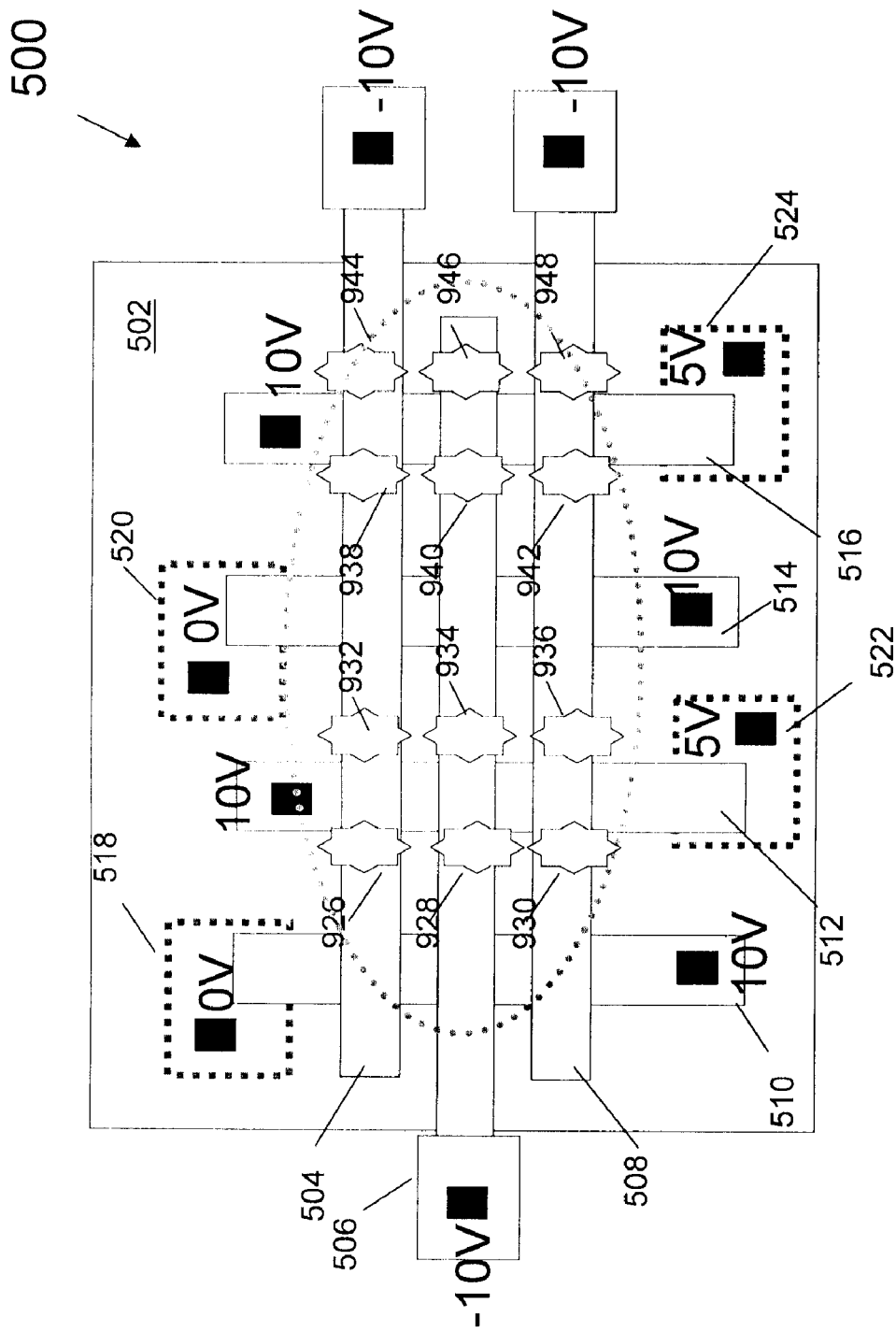
FIG. 10 is a diagram illustrating one example method of erasing multiple bits.

FIGS. 9 and 10 are diagrams illustrating example processes for erasing bits for cells in array 500. In the examples of FIGS. 9 and 10, Band To Band Hot Hole (BTBHH) tunneling is used to erase multiple bits at a time.

For example, in FIG. 9 the bits adjacent to bit lines 510 and 514 can be erased in one process via BTBHH tunneling. First, a positive voltage is applied to each of bit lines 510, 512, 514, and 516 to produce inversion bit lines in the upper layers of substrate 502 under bit lines 510, 512, 514, and 516. Again, the inversion bit lines are used to conduct the source and drain voltages needed to perform the BTBHH erasing. Positive voltages are then applied to diffusion regions 518 and 520 to produce minority carriers in the upper regions of diffusion region 518 and 520. A large negative voltage is then applied to bit lines 504, 506, and 508 in order to cause those minority carriers to tunnel into the gate structures of the selected cells, where they will compensate for any electrons trapped in the gate structure e.g., via CHE programming as described in relation to FIGS. 7 and 9. Diffusion regions 522 and 524 can be tied to 0 volts.

In the example of FIG. 9, each of bits 902, 904, 906, 908, 910, 912, 914, 916, 918, 920, 922, and 924 can be erased during one erase operation. It will be understood, however, that more or less bits can be erased by applying the appropriate voltages to the appropriate word and bit lines, while isolating other cells by tying the word and bit lines associated with those cells to 0 volts or letting them float as appropriate.

In the example of FIG. 9, a positive voltage of approximately +10 volts is applied to bit lines 510, 512, 514, and 516. A large negative voltage of approximately −10 volts is applied to bit lines 504, 506, and 508. A positive voltage of approximately +5 volts is applied to diffusion regions 518 and 520. It will be understood, however, that the voltages illustrated with respect to FIG. 9 are by way of example only and that the actual voltages used will depend on the requirements of a specific implementation.

FIG. 10 is a diagram illustrating BTBHH erasing of the bits adjacent to bit lines 512 and 516. Accordingly, a positive voltage is again applied to bit lines 510, 512, 514, and 516 to produce the inversion bit lines in the upper layers of substrate 502. Positive voltages are then applied to diffusion regions 522 and 524 in order to produce the minority carriers needed for the BTBHH operation. A large negative voltage is applied to word lines 504, 506, and 508 in order to attract minority carriers into the gate structures of the selected cells to erase bits 926, 928, 930, 932, 934, 936, 938, 940, 942, 944, 946, and 948 at the same time. Diffusion regions 518 and 520 can be tied to 0 volts.

In the example of FIG. 10, a positive voltage of approximately +10 volts can be applied to bit lines 510, 512, 514, and 516. Negative voltages of approximately −10 volts can be applied to word lines 504, 506, and 508. Positive voltages of approximately +5 volts can be applied to diffusion regions 522 and 524. It will be understood, however, that the voltages illustrated with respect to FIG. 10 are by way of example only and that the actual voltages used will depend on the requirements of a specific implementation.

Figure 11:
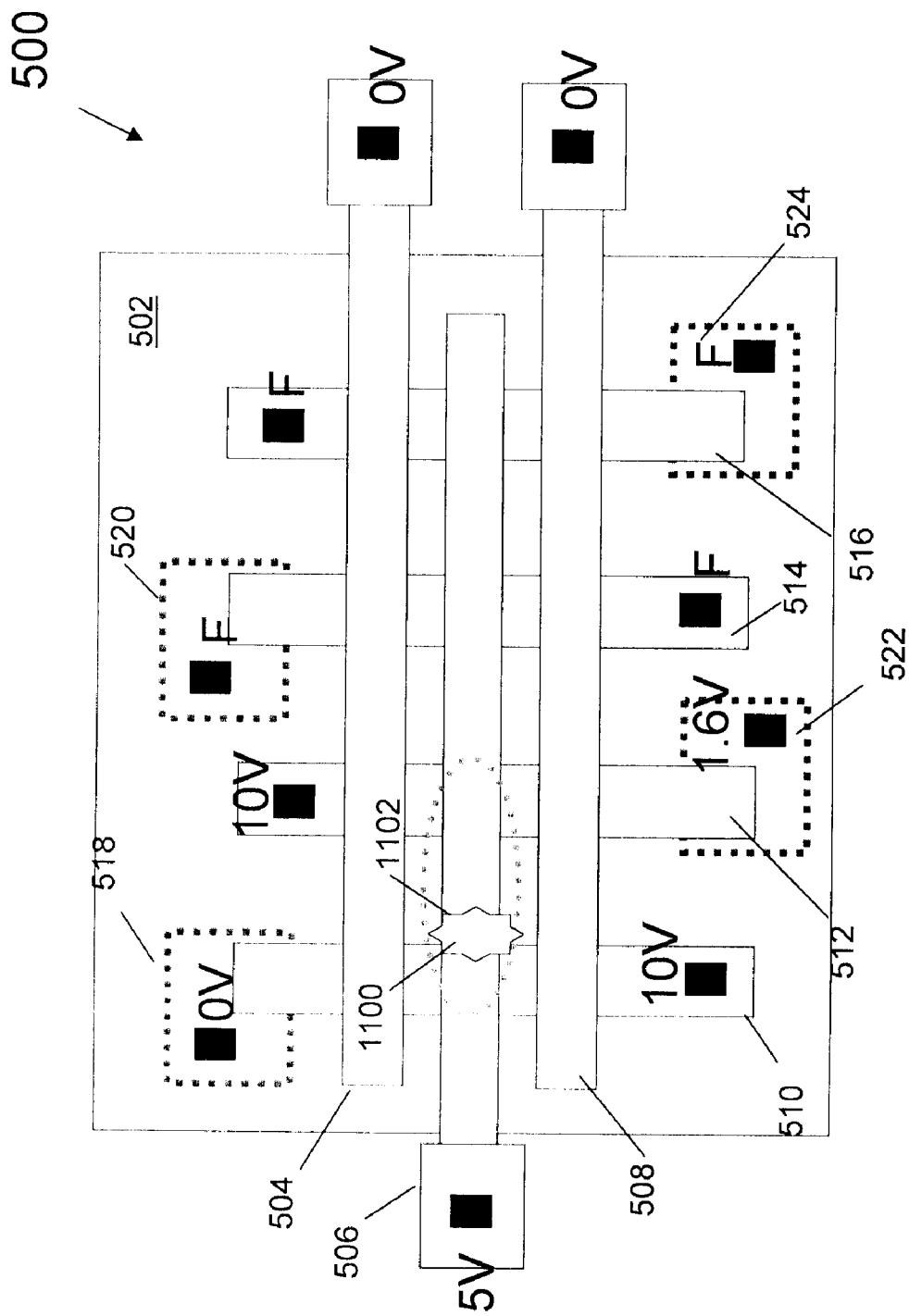
FIG. 11 is a diagram illustrating one example method for reading a first bit of a selected cell.

FIG. 11 is a diagram illustrating an example process for reading a first bit 1102 of a selected cell 1100 in array 500. In order to read bit 1102, a positive voltage is applied to bit lines 510 and 512 in order to create inversion bit lines in the upper layer substrate 502 under bit lines 510 and 512. A positive voltage is applied to word line 506 and to diffusion region 522. Diffusion region 518 can be tied to 0 volts. Word lines 504 and 508 can also be tied to 0 volts, while bit lines 514 and 516 as well as diffusion regions 520 and 524 are allowed to float.

In the example of FIG. 11, a positive voltage of approximately +10 volts is applied to bit lines 510 and 512, while a positive voltage of approximately +5 volts is applied to word line 506. A positive voltage of approximately +1.6 volts is applied to diffusion region 522. It will be understood, however, that the voltages illustrated with respect to FIG. 11 are by way of example only and that the actual voltages used will depend on the requirements of a specific implementation.

Figure 12:
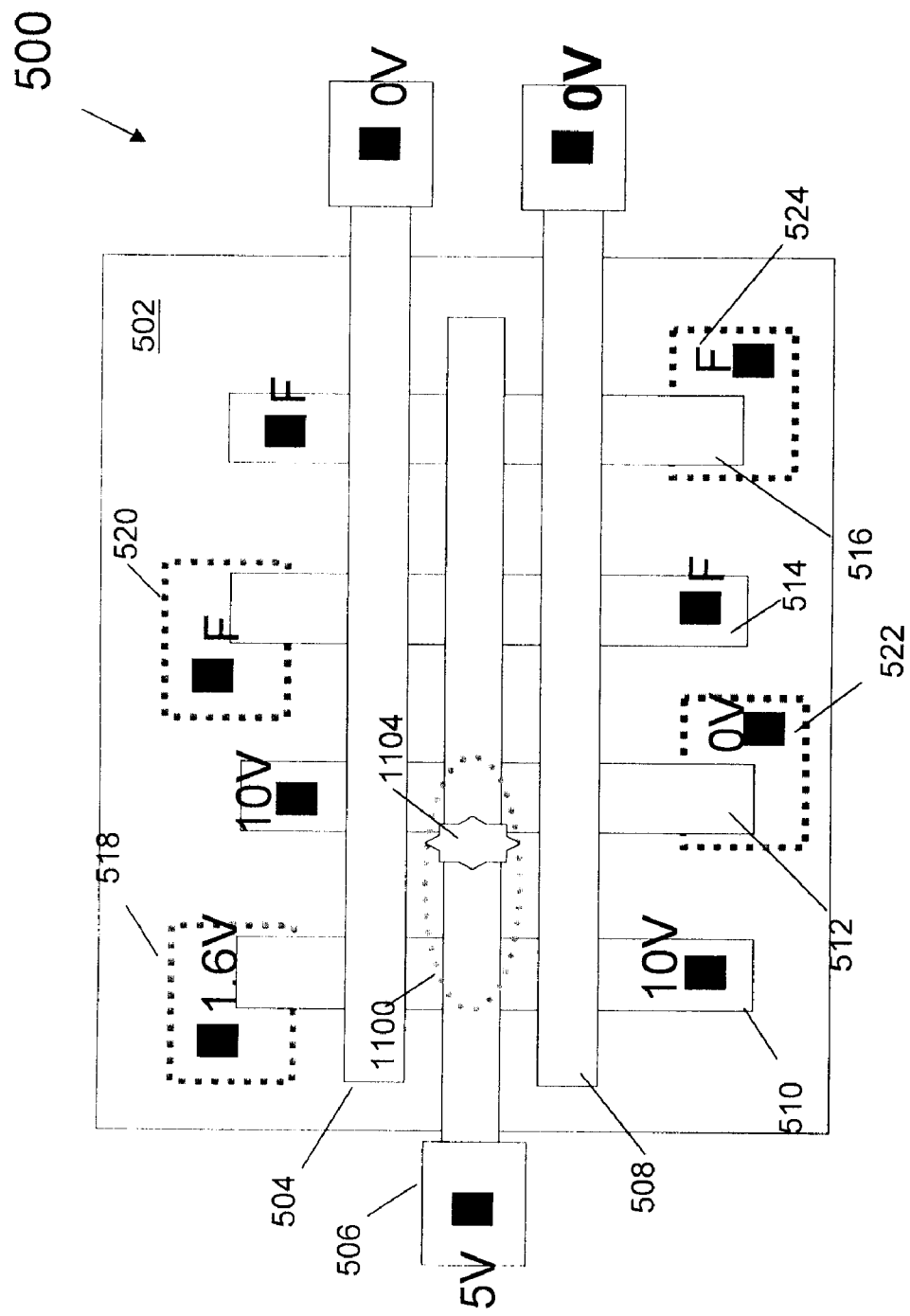
FIG. 12 is a diagram illustrating one example method for reading a second bit of a selected cell.

FIG. 12 is a diagram illustrating an example process for reading a second bit 1104 of selected cell 1100. Thus, a positive voltage can be applied to bit lines 510 and 512 to create the inversion bit lines in the upper layers of substrate 502. A positive voltage can then be applied to word line 506 and to diffusion region 518, while diffusion region 522 is tied to 0 volts. Word lines 504 and 508 can be tied to 0 volts, while bit lines 514 and 516 as well as diffusion regions 520 and 524 are allowed to float.

In the example of FIG. 12, a positive voltage of approximately +10 volts is applied to bit lines 510 and 512, while a positive voltage of approximately +5 volts is applied to word line 506. A positive voltage of approximately +1.6 volts can be applied to diffusion region 518. It will be understood, however, that the voltages illustrated in respect of FIG. 12 are by way of example only and that the actual voltages used will depend on the requirements of a specific implementation.

Figure 6C:
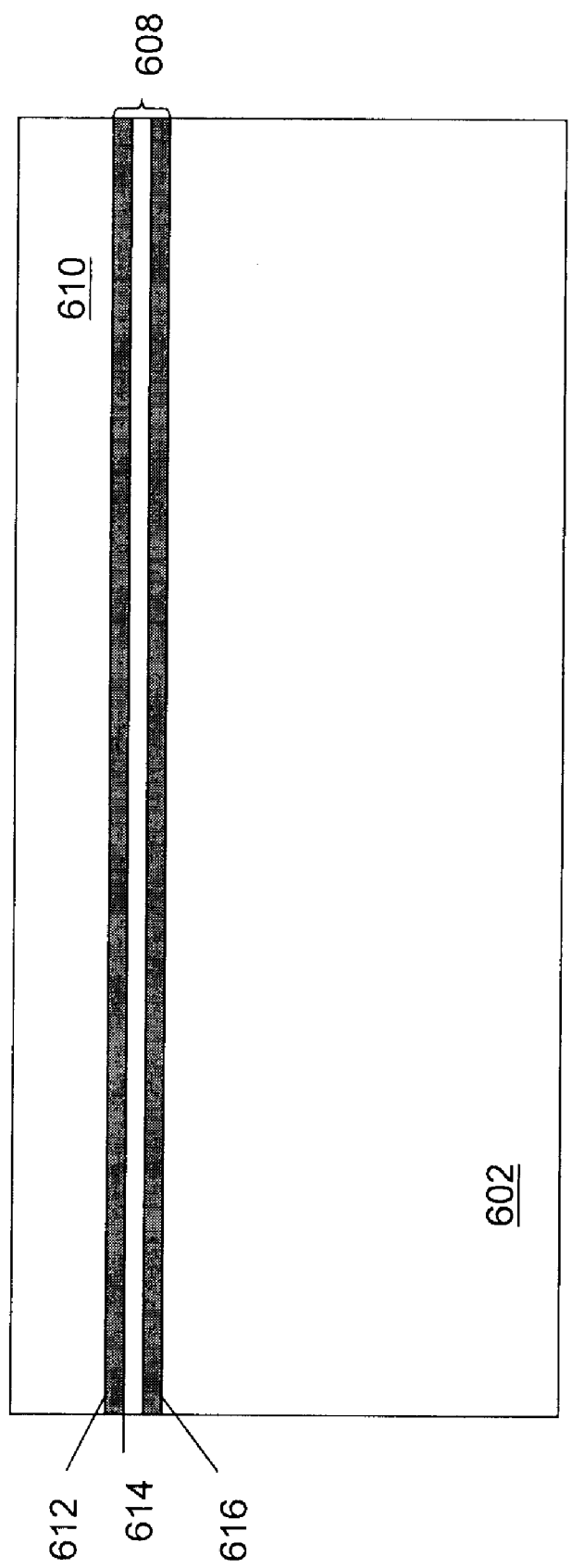

FIGS. 6A through 6H are diagrams illustrating an example process for fabricating a virtual ground structure that uses inversion bit line such as structure 100 in FIG. 1. As illustrated in FIG. 6A, the fabrication of the virtual ground array structure begins with formation of a substrate 602. In the example of FIG. 6A, substrate 602 is a P type substrate; however, it will be apparent that substrate 602 can, depending on the embodiment, also be and an N-type substrate.

As illustrated in FIG. 6B, implantation regions 604 and 606 can then be formed in substrate 602. In this example, implantation regions 602 and 604 are N+ implantation regions; however, it will be apparent that in embodiments where substrate 602 is an N-type substrate, implantation regions 602 and 604 will be P+ implantation regions.

Implantation regions 602 and 604 can be formed by forming a photoresist layer over substrate 602. The photoresist layer can define region 602 and 604. Implantation region 602 and 604 can then be formed and the photoresist layer can be removed.

It will understood, that implantation regions 604 and 606 are formed by accelerating ions at high energy onto substrate 602, where they will be driven into substrate 602 and become embedded in the areas left unprotected by the photoresist layer. In certain embodiments, an annealing step can be used to heal any damage that result from the ion implantation.

As illustrated in FIG. 6C, after implantation of region 604 and 606, a dielectric structure 608 can be formed over substrate 602. For example, dielectric structure 608 can comprise an ONO structure formed from oxide layer 612, SiN layer 614, and oxide layer 616. Layers 612, 614, and 616 can be formed, for example, using Chemical Vapor Deposition (CVD). In other embodiments, dielectric structure 608 can comprise an ON structure or an oxide layer. In still other embodiments, a dielectric structure 608 can be formed after the etching step described in relation to FIG. 6D. For example, a dielectric structure 608 can comprise an oxide layer re-grown after etching of ONO layers 612, 614, and 616. In another embodiment, the dielectric structure can comprise a residual oxide layer formed after etching of an ON layer formed over substrate 602.

A polysilicon layer 610 can then be deposited over structure 608. Again, polysilicon layer 610 can be deposited using CVD.

Figure 6D:
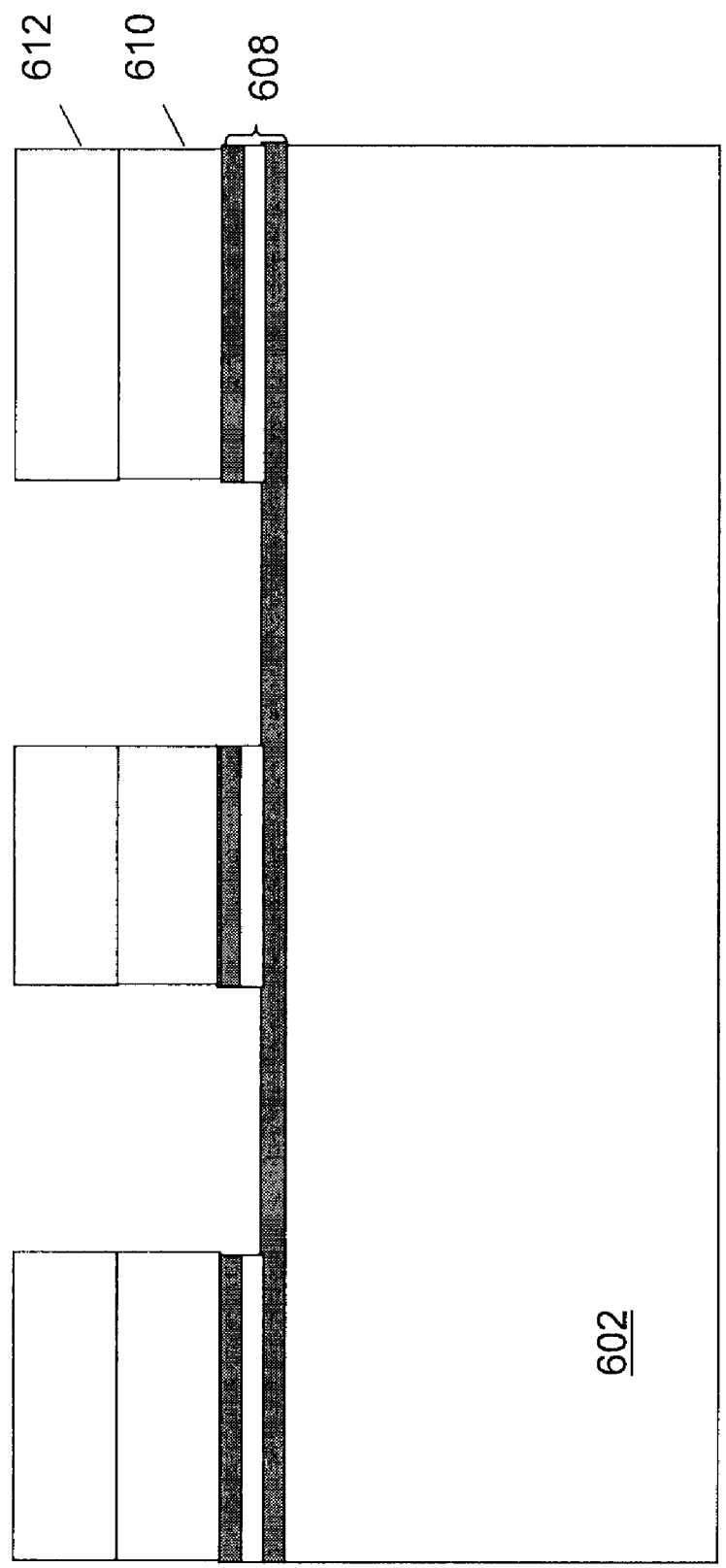

In FIG. 6D, a photoresist 612 can be formed over N-type polysilicon layer 610 as illustrated. Photoresist layer 612 can be used to define layer 610 and 608. Once photoresist layer 612 is formed, layer 608 and 610 can then be etched accordingly. After layer 608 and 610 are etched, photoresist layer 612 can be removed. The etching chemical and/or process used should be such that the etching stops at layer oxide layer 616.

Figure 6E:
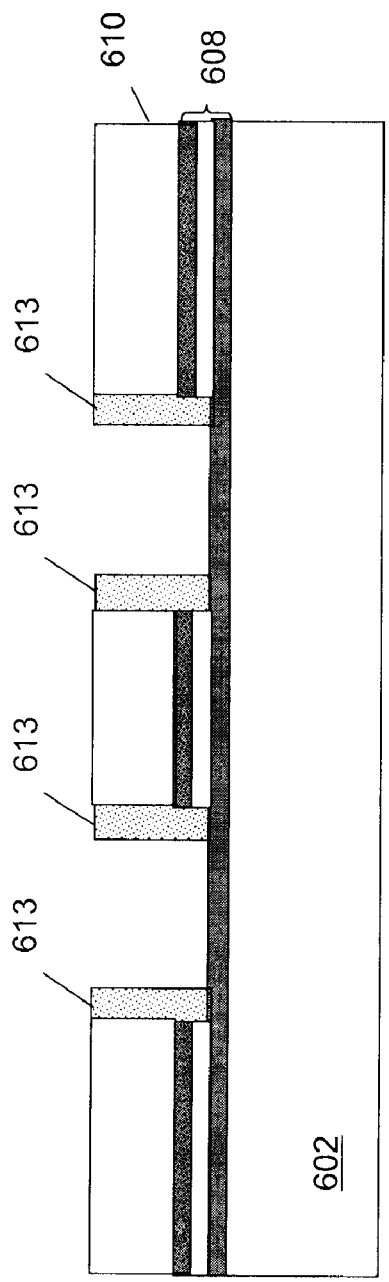
Figure 6F:
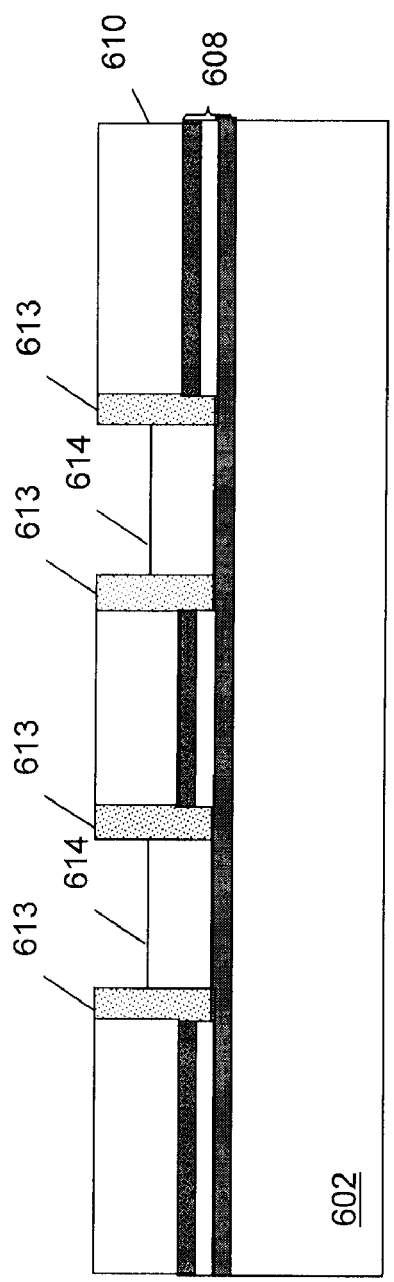

As illustrated in FIG. 6E, the trenches formed in the etching step described above can then be lined with oxide spacers 613. Polysilicon layer 614 can then be formed in the trenches as illustrated in FIG. 6F. Polysilicon layer 614 can form the bit lines for the array.

Figure 6G:
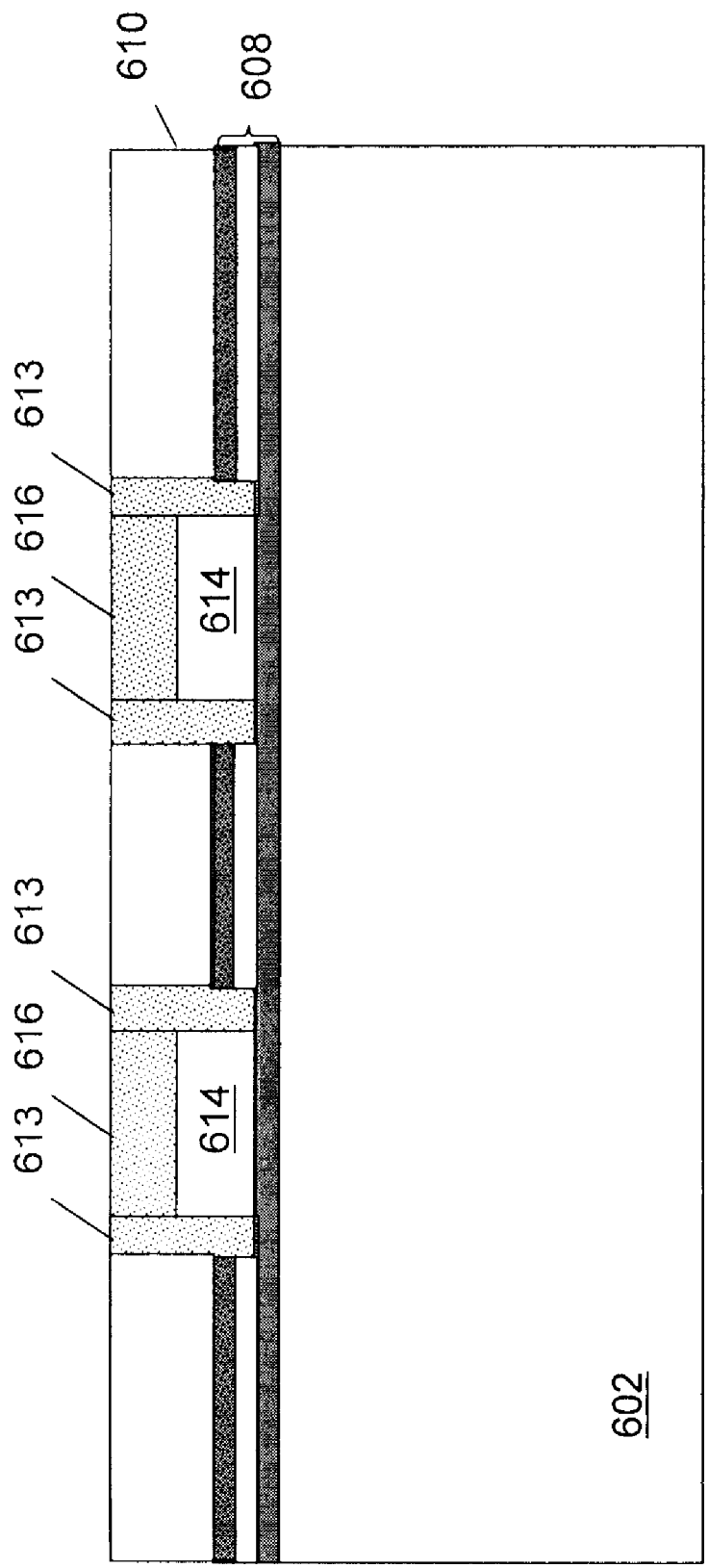

As illustrated in FIG. 6G, a dielectric layer such as oxide layer 616 can then be formed over polysilicon layer 614. For example, in one embodiment, oxide layer 616 can be formed using High Density Plasma techniques (HDP). Formation of the HDP oxide can then be followed by a planarization step. For example, an etch back process or chemical-mechanic-polish can be used to planarize the upper layers of the structure illustrated in FIG. 6G.

Figures 6H, 6I:
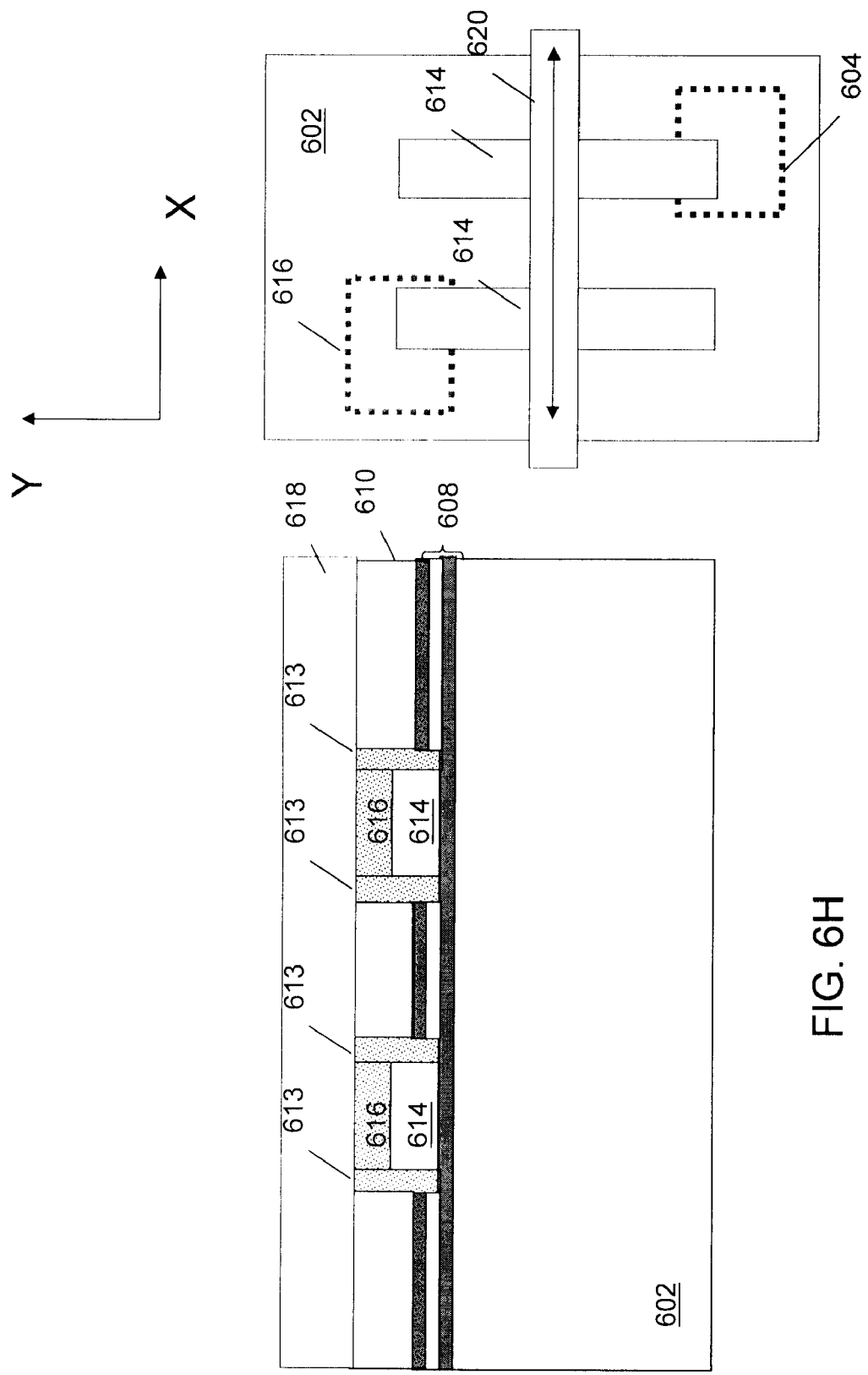

A polysilicon layer 618 can then be deposited over the planarized structure as illustrated in FIG. 6H. A photoresist layer (not shown) can then be formed in order to define layer 618. Layer 618 can then be etched accordingly to form word lines, such as word line 620 illustrated in FIG. 6I.

FIG. 6I is a diagram illustrating the top view of an example structure fabricated using the process steps illustrated in FIGS. 6A-6H.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A virtual ground array device, comprising:
   a substrate;
   a first bit line having a first dielectric layer that is in direct contact with a top surface of the first bit line and spacers that are in direct contact with sidewall surfaces of the first bit line;
   a second bit line having a second dielectric layer that is in direct contact with a top surface of the second bit line and spacers that are in direct contact with sidewall surfaces of the second bit line;
   a word line;
   a first diffusion region, the first bit line configured to form a first inversion bit line in or near the first diffusion region when a sufficient voltage is applied to the first bit line,
   a second diffusion region, the second bit line configured to form a second inversion bit line in or near the second diffusion region when a sufficient voltage is applied to the second bit line, and
   a gate structure formed on the substrate, the gate structure connected with the word line and configured to form a channel region in the substrate between the first and second inversion bit lines when a sufficient voltage is applied to the gate via the word line.

2. The virtual ground array device of claim 1, wherein the gate structure comprises a polysilicon layer and a gate dielectric layer.

3. The virtual ground array device of claim 2, wherein the gate dielectric layer comprises an Oxide-Nitride-Oxide (ONO) structure.

4. The virtual ground array device of claim 1, further comprising a dielectric layer under the first and second bit lines.

5. The virtual ground array device of claim 4, wherein the dielectric layer under the first and second bit lines comprises an ONO structure.

6. The virtual ground array device of claim 4, wherein the dielectric layer under the first and second bit lines comprises an oxide layer.

7. The virtual ground array device of claim 4, wherein the dielectric layer under the first and second bit lines comprises an ON structure.

8. The virtual ground array device of claim 4, wherein the dielectric layer under the first and second bit lines comprises a residual oxide layer formed after an ON etch process.

9. The virtual ground array device of claim 4, wherein the dielectric layer under the first and second bit lines comprises re-grown oxide layer formed after an ONO etch process.

10. The virtual ground array device of claim 1, wherein the first inversion bit line is formed by applying a voltage of about 5-10 volts to the first bit line.

11. The virtual ground array device of claim 1, wherein the second inversion bit line is formed by applying a voltage of about 5-10 volts to the second bit line.

12. The virtual ground array device of claim 1, wherein the first and second inversion bit lines are configured to conduct voltages from the first and second diffusion regions respectively.

13. The virtual ground array device of claim 1, further comprising a plurality of word lines.

14. The virtual ground array device of claim 1, wherein the word line is not parallel with the first and second bit lines.

15. The virtual ground array of claim 1, further comprising oxide spacers on each side of the first and second bit lines.

* * * * *